US012635544B2

(12) United States Patent
Gowda et al.

(10) Patent No.: US 12,635,544 B2
(45) Date of Patent: May 19, 2026

(54) POWER OVERLAY PACKAGE FOR A SEMICONDUCTOR DEVICE COUPLED TO A POL-RDL PACKAGE

(71) Applicant: General Electric Company, Schenectady, NY (US)

(72) Inventors: Arun Virupaksha Gowda, Rexford, NY (US); Ljubisa D. Stevanovic, Clifton Park, NY (US); Christopher James Kapusta, Delanson, NY (US); Robert Dwayne Gossman, Clifton Park, NY (US); Risto Ilkka Sakari Tuominen, Helsinki (FI)

(73) Assignee: General Electric Company, Evendale, OH (US)

( * ) Notice: Subject to any disclaimer, the term of this patent is extended or adjusted under 35 U.S.C. 154(b) by 639 days.

(21) Appl. No.: 18/166,192

(22) Filed: Feb. 8, 2023

(65) Prior Publication Data

US 2024/0266270 A1      Aug. 8, 2024

(51) Int. Cl.
H01L 23/498 (2006.01)
H01L 21/48 (2006.01)

(52) U.S. Cl.
CPC ...... H01L 23/49838 (2013.01); H01L 21/486 (2013.01); H01L 23/49861 (2013.01)

(58) Field of Classification Search
CPC ............. H01L 23/49838; H01L 21/486; H01L 23/49861
See application file for complete search history.

(56) References Cited

U.S. PATENT DOCUMENTS

| 5,637,922 | A | 6/1997 | Fillion | |
|---|---|---|---|---|
| 6,060,795 | A | 5/2000 | Azotea | |
| 8,334,602 | B2 | 12/2012 | Kang | |
| 9,368,563 | B2 | 6/2016 | Lin | |
| 9,679,878 | B1 * | 6/2017 | Lin | ..................... H01L 21/0273 |
| 9,978,655 | B2 | 5/2018 | Scanlan | |

(Continued)

FOREIGN PATENT DOCUMENTS

| FR | 3127024 | 3/2023 |
|---|---|---|
| FR | 3127025 | 3/2023 |

(Continued)

OTHER PUBLICATIONS

Cai Chen et al., "A review of SiC power module packaging: Layout, material system and integration", IEEE Xplore, vol. 02, Issue: 03, pp. 170-186, Sep. 2017.

(Continued)

*Primary Examiner* — Michael Jung
(74) *Attorney, Agent, or Firm* — Fitch, Even, Tabin & Flannery LLP

(57) ABSTRACT

A semiconductor assembly includes a semiconductor device and a POL-RDL package coupled to said device. The device includes an upper surface, a gate pad and at least one source pad disposed on said upper surface. The POL-RDL package includes a dielectric layer having at least one source pad electrically coupled to said at least one source pad of said device and at least one contact pad disposed. At least one trace connection having a resistivity value electrically couples said at least one source pad of said POL-RDL package to said at least one contact pad.

19 Claims, 7 Drawing Sheets

(56) References Cited

U.S. PATENT DOCUMENTS

| | | | | |
|---|---|---|---|---|
| 10,083,916 | B2 | 9/2018 | Shim | |
| 10,204,881 | B2 | 2/2019 | Gowda | |
| 10,734,247 | B2 | 8/2020 | Sirinorakul | |
| 11,251,106 | B2 | 2/2022 | Qin | |
| 2008/0305582 | A1* | 12/2008 | Fillion | H01L 23/4822 |
| | | | | 438/118 |
| 2015/0279757 | A1* | 10/2015 | Tan | H01L 23/3157 |
| | | | | 257/692 |
| 2020/0091686 | A1 | 3/2020 | Yang | |
| 2020/0194387 | A1 | 6/2020 | Arthur | |
| 2022/0230930 | A1* | 7/2022 | Grassmann | H01L 23/3735 |

FOREIGN PATENT DOCUMENTS

| | | |
|---|---|---|
| FR | 3127269 | 3/2023 |
| FR | 3129375 | 5/2023 |
| FR | 3129428 | 5/2023 |
| FR | 3129432 | 5/2023 |
| FR | 3129436 | 5/2023 |
| FR | 3129690 | 6/2023 |
| FR | 3129970 | 6/2023 |
| FR | 3129972 | 6/2023 |
| FR | 3130313 | 6/2023 |
| FR | 3130323 | 6/2023 |
| FR | 3130747 | 6/2023 |
| FR | 3130874 | 6/2023 |
| FR | 3130875 | 6/2023 |
| FR | 3130877 | 6/2023 |
| FR | 3130879 | 6/2023 |
| FR | 3130894 | 6/2023 |
| FR | 3130895 | 6/2023 |
| FR | 3130896 | 6/2023 |
| FR | 3130897 | 6/2023 |
| FR | 3132279 | 8/2023 |
| FR | 3132729 | 8/2023 |
| FR | 3132743 | 8/2023 |
| FR | 3133367 | 9/2023 |
| FR | 3133368 | 9/2023 |
| JP | 2007053379 | 3/2007 |
| JP | 2016225629 | 12/2016 |
| JP | 2018006492 | 1/2018 |
| JP | 2018133463 | 8/2018 |
| JP | 2019140364 | 8/2019 |
| JP | 2022088990 | 6/2022 |

OTHER PUBLICATIONS

Danfoss Bond Buffer (DBB)-Brochure DKSP.PB.402.A2.02 dated Apr. 2016; Danfoss Slicon Power GmbH; 4 pgs.

Danfoss Bond Buffer P3-Brochure DKSP.PB.401.A2.02 dated May 2016; Danfoss Slicon Power GmbH; 2 pgs.

Danfoss Silicon Power-North America-Brochure DKSP.PB.436.A1. 22 dated Feb. 2019; Danfoss Slicon Power GmbH; 8 pgs.

Fengze Hou et al., "Review of Packaging Schemes for Power Module",IEE Xplore, vol. 08,Issue: 01, pp. 223-238, Mar. 2020.

Nishihara Youichi et al: "Evaluation of electrical and thermal properties of POL-kW by simulation and actual measurement", 2022 IEEE Cpmt Symposium Japan (ICSJ), IEEE, Nov. 9, 2022 (Nov. 9, 2022), pp. 150-153, XP034290021, Doi: 10.1109/ICSJ55786. 2022.10034735.

Murayama Kei et al: "POL tile as a small 1-14 package for a power module", 2022 IEEE Applied Power Electronics Conference and Exposition (APEC), IEEE, Mar. 20, 2022, pp. 1672-1677.

* cited by examiner

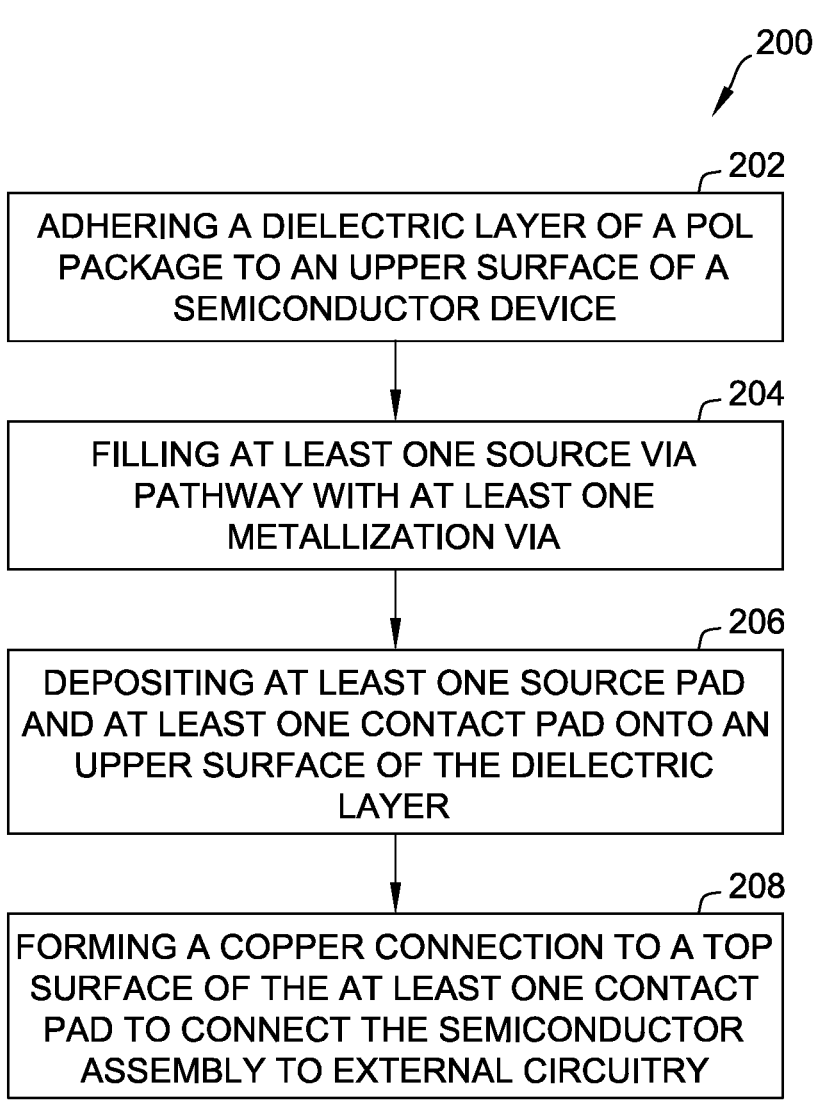

200

202

ADHERING A DIELECTRIC LAYER OF A POL PACKAGE TO AN UPPER SURFACE OF A SEMICONDUCTOR DEVICE

204

FILLING AT LEAST ONE SOURCE VIA PATHWAY WITH AT LEAST ONE METALLIZATION VIA

206

DEPOSITING AT LEAST ONE SOURCE PAD AND AT LEAST ONE CONTACT PAD ONTO AN UPPER SURFACE OF THE DIELECTRIC LAYER

208

FORMING A COPPER CONNECTION TO A TOP SURFACE OF THE AT LEAST ONE CONTACT PAD TO CONNECT THE SEMICONDUCTOR ASSEMBLY TO EXTERNAL CIRCUITRY

POWER OVERLAY PACKAGE FOR A SEMICONDUCTOR DEVICE COUPLED TO A POL-RDL PACKAGE

BACKGROUND

The present disclosure relates generally to semiconductor devices, and more particularly to semiconductor devices having a power overlay package.

Power semiconductor assemblies include devices used as switches or rectifiers in power electronic circuits, such as switched mode power supplies and the like. Power semiconductor devices are used in high voltage power applications to carry large amounts of current and to support large voltages. In use, high voltage power semiconductor devices are connected to an external circuit by way of power overlay ("POL") packages and an interconnect system.

In at least some known assemblies, a POL package is layered onto a semiconductor device. The semiconductor device includes at least one source pad and a gate pad disposed on a top surface of the semiconductor device. The POL package includes at least one POL interconnect layer configured as a routing layer. The at least one POL interconnect layer is laminated with at least one dielectric layer (also referred to as an isolation film) deposited on the semiconductor device, and metallization vias extending through the dielectric layer. The metallization vias electrically couple the at least one source pad of the semiconductor device to a source pad disposed on a top surface of the dielectric layer, while a gate pad disposed on the top surface of the dielectric layer is coupled to the gate pad of the semiconductor device. A contact pad (such as a Kelvin contact) disposed on the top surface of the dielectric layer is electrically coupled to the source pad of the dielectric layer.

POL packages generally utilize connections to electrically couple to the source pad, to the contact pad, and to the gate pad on the dielectric layer to deliver power to the semiconductor device through the metallization vias. To establish a proper electrical connection, the source pad, the contact pad, and the gate pad on the dielectric layer require sufficient surface area to solder, sinter, copper bond, copper clip, or otherwise connect the source pad, the contact pad, and the gate pad with the connections. However, the surface areas of the source pad, the contact pad, and the gate pad are generally limited by the overall surface area of the semiconductor device. Further, direct soldering, sintering, copper bonding, and copper clipping to the source pad and the gate pad on the semiconductor device, without a POL package, introduces bonding stresses onto the semiconductor device. The introduction of the source pad, the contact pad, and the gate pad on the dielectric layer of the POL package provides stress buffering and reduces the stress on to the semiconductor device.

Therefore, there is a need to improve available surface of the POL package such that larger source pads, contact pads and gate pads can be utilized while not reducing available active area of the semiconductor devices, and to reduce bonding stress of the bonding connections to the semiconductor device surface.

BRIEF DESCRIPTION

In one aspect, a semiconductor assembly including a semiconductor device and a POL-RDL package coupled to said semiconductor device is disclosed. The device includes an upper surface, a gate pad disposed on said upper surface; and at least one source pad disposed on said upper surface.

The POL-RDL package includes a dielectric layer comprising an upper surface, at least one source pad disposed on said upper surface of said dielectric layer and electrically coupled to said at least one source pad of said semiconductor device; at least one contact pad disposed on said upper surface of said dielectric layer; and at least one trace connection having a resistivity value and electrically coupling said at least one source pad of said POL-RDL package to said at least one contact pad.

In another aspect, method of manufacturing a semiconductor assembly is disclosed. The method includes coupling a dielectric layer of a POL-RDL package to an upper surface of a semiconductor device, the semiconductor device including at least one source pad and a gate pad disposed on the upper surface; forming at least one source pad of the POL-RDL package on an upper surface of the dielectric layer; electrically coupling the at least one source pad of the POL-RDL package to the at least one source pad of the semiconductor device; forming a gate pad of the POL-RDL package on the upper surface of the dielectric layer; electrically coupling the gate pad of the POL-RDL package to the gate pad of the semiconductor device; forming at least one contact pad on the upper surface of the dielectric layer; and electrically coupling the at least one source pad of the POL-RDL package to the at least one contact pad using at least one trace connection having a resistivity value.

BRIEF DESCRIPTION OF THE DRAWINGS

The subject-matter of the disclosure will be explained in more detail in the following text with reference to exemplary embodiments which are illustrated in the attached drawings.

FIG. 7 illustrates one embodiment of a method of manufacturing a semiconductor assembly;

The reference symbols used in the drawings, and their meanings, are listed in summary form in the list of reference symbols. In principle, identical parts are provided with the same reference symbols in the figures.

DETAILED DESCRIPTION

Figure 1:
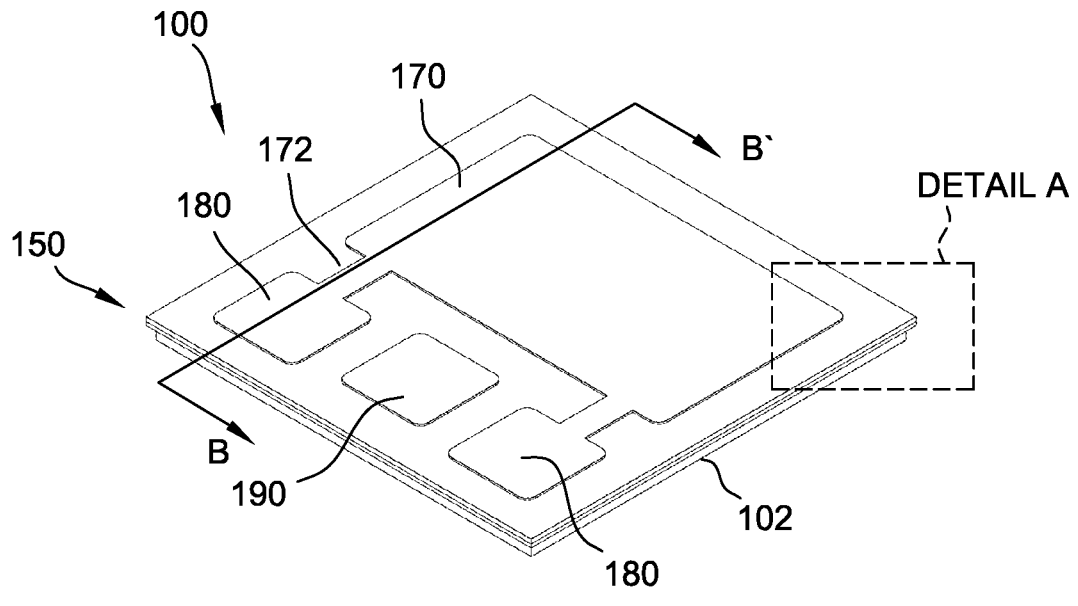
FIG. 1 is a perspective view of a semiconductor assembly including a POL package disposed on a semiconductor device in accordance with one or more embodiments of the present disclosure.

In the following specification and the claims, reference will be made to a number of terms, which shall be defined to have the following meanings.

As used herein, the singular forms "a," "an," and "the" include plural references unless the context clearly dictates otherwise. The terms "comprising," "including," and "having" are intended to be inclusive and mean that there may be additional elements other than the listed elements. The terms "optional" or "optionally" means that the subsequently described event or circumstance may or may not occur, and that the description includes instances where the event occurs and instances where it does not.

Unless otherwise indicated, approximating language, such as "generally," "substantially," and "about," as used herein indicates that the term so modified may apply to only an approximate degree, as would be recognized by one of ordinary skill in the art, rather than to an absolute or perfect degree. Accordingly, a value modified by a term or terms, such as "about," "approximately," and "substantially," is not to be limited to the precise value specified. In at least some instances, the approximating language may correspond to the precision of an instrument for measuring the value. Here and throughout the specification and claims, range limitations may be identified. Such ranges may be combined and/or interchanged, and include all the sub-ranges contained therein unless context or language indicates otherwise.

Additionally, unless otherwise indicated, the terms "first," "second," etc. are used herein merely as labels, and are not intended to impose ordinal, positional, or hierarchical requirements on the items to which these terms refer. Moreover, reference to, for example, a "second" item does not require or preclude the existence of, for example, a "first" or lower-numbered item or a "third" or higher-numbered item.

Embodiments of the disclosure relate generally to structures and methods for packaging semiconductor devices and, more particularly, to semiconductor devices including an overhanging POL structure. The methods, systems, and apparatus described herein overcome at least some disadvantages of at least some known power semiconductor devices having POL packages. More specifically, the systems and apparatus described herein provide a POL package configured as a redistribution layer (RDL) positioned directly over a power semiconductor device. Accordingly, the POL package is also referred to herein as a POL-RDL package. The POL-RDL package includes an oversized surface area relative to the semiconductor device, which improves available surface area for placement of a source pad, a gate pad, and a contact pad on a top surface of the POL-RDL package. The improved available surface area allows for the use of larger source pads, contact pads, and gate pads, which reduce bonding stress on the semiconductor device. Furthermore, the improved available surface area allows for use of various trace configurations for POL-RDL packages.

A semiconductor assembly including a semiconductor device and a POL-RDL package configured as a redistribution layer for the semiconductor device is disclosed. The semiconductor device includes at least one source pad and a gate pad disposed on a die having a surface area and an outer peripheral edge. The POL-RDL package includes a dielectric layer and an adhesive layer that is in contact with the semiconductor device. At least one source pad, a gate pad, and at least contact pad of the POL-RDL package are positioned on an upper surface of the dielectric layer. At least one source via pathway and a gate via pathway extend through the dielectric layer and the adhesive layer, and metallization vias are formed within the via pathways to connect the gate pad and the at least one source pad of the semiconductor device to the gate pad and the at least one source pad of the POL-RDL package, respectively. The POL-RDL package, and in particular the dielectric layer of the POL-RDL package, has an outer peripheral edge and a surface area greater than the surface area of the semiconductor device such that the outer peripheral edge of the dielectric layer extends beyond the outer peripheral edge of the semiconductor device, defining an overhang region. The larger surface area of the POL-RDL package increases available surface area for the sizes and positions of the gate pad, the at least one source pad, and the at least one contact pad of the POL-RDL package. This allows for greater flexibility in the use of traces connecting the at least one contact pad to the at least one source pad of the POL-RDL package, as described herein.

Figure 2:
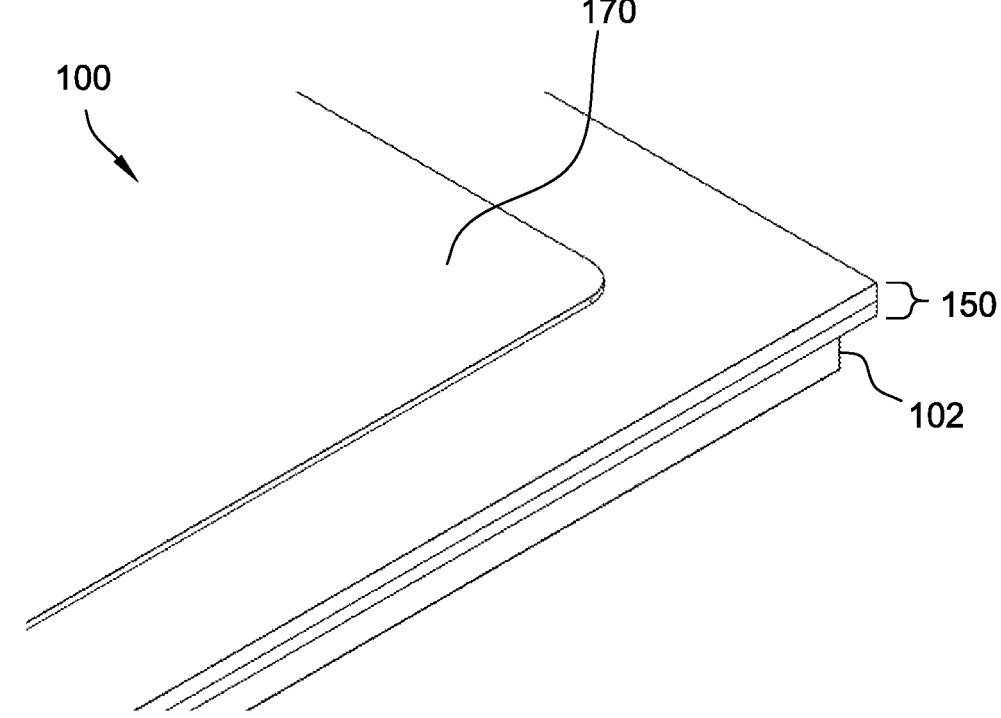
FIG. 2 is an enlarged view of Detail A of the semiconductor assembly of FIG. 1.

FIG. 1 illustrates a perspective view of an example semiconductor assembly 100 in accordance with one or more embodiments of the present disclosure. FIG. 2 illustrates an enlarged view of Detail A of the semiconductor assembly 100, FIG. 3 illustrates an exploded view of the semiconductor assembly 100, and FIG. 4 illustrates a cross-sectional view of the semiconductor assembly 100 taken along line B-B'.

Figure 3:
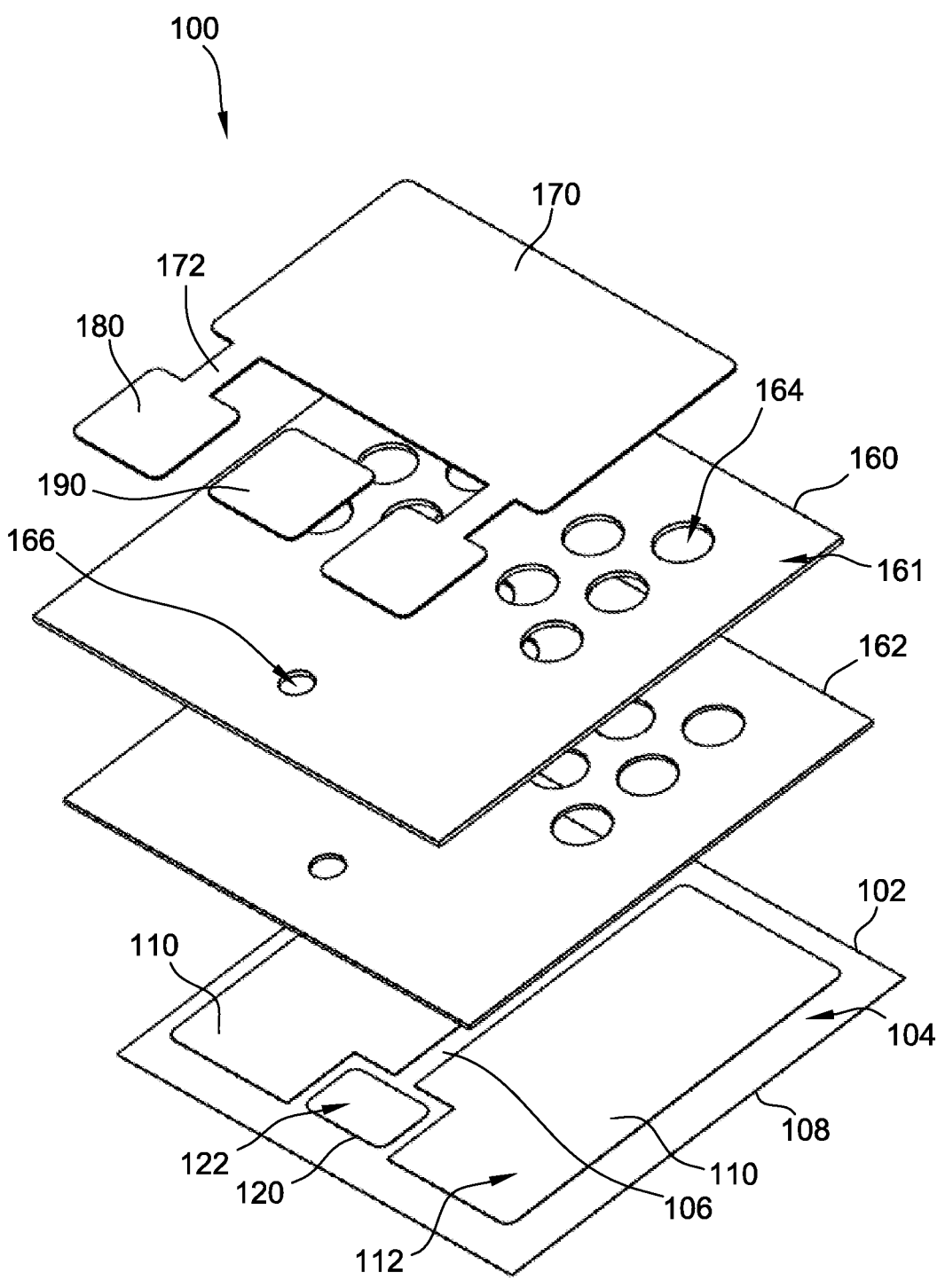
FIG. 3 is an exploded view of the semiconductor assembly of FIG. 1.
Figure 4:
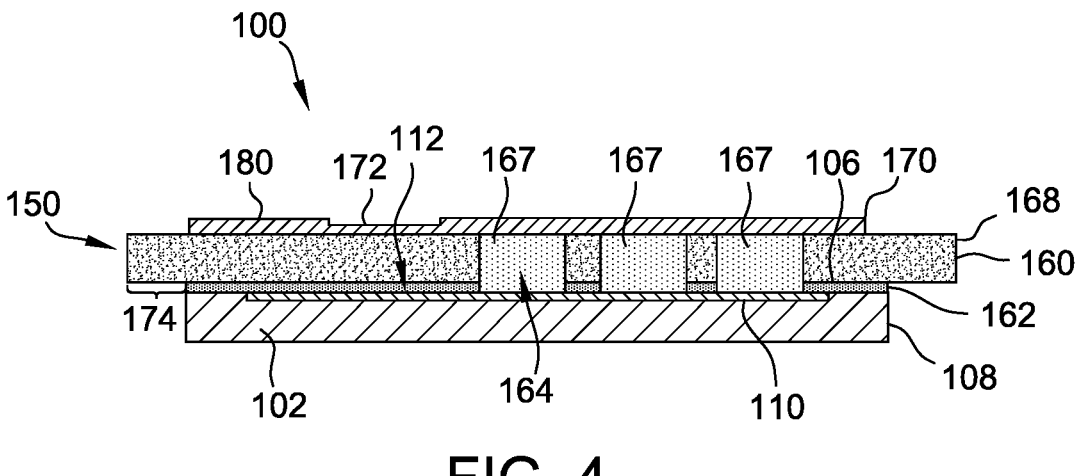
FIG. 4 is a cross-sectional view of the semiconductor assembly of FIG. 1 taken along line B-B'.

As shown in FIGS. 1 through 4, the semiconductor assembly 100 includes a POL-RDL package 150 disposed on a semiconductor device 102. As best shown in FIGS. 3 and 4, the semiconductor device 102 includes a dielectric material 106 that defines an upper surface 104. An outer peripheral edge 108 of the dielectric material 106 defines a surface area of the semiconductor device 102. The semiconductor device 102 further includes at least one source pad 110 and a gate pad 120 disposed on the dielectric material 106. The at least one source pad 110 includes a top contact surface 112 and the gate pad 120 includes a top contact surface 122. The gate pad 120 and the at least one source pad 110 are spaced apart from each other on the dielectric material 106. As best shown in FIG. 3, the gate pad 120 and the at least one source pad 110 are spaced from the outer peripheral edge 108 of the semiconductor device 102. In some embodiments, at least a portion of the gate pad 120 and the at least one source pad 110 extend below the upper surface 104. Further, in some embodiments, the top contact surface 112 of the at least one source pad 110 and the top contact surface 122 of the gate pad 120 are flush. The at least one source pad 110 is electrically isolated from adjacent source pads 110 on the semiconductor device 102.

The at least one source pad 110 of the semiconductor device 102 is used for electricity control and conversion. By way of example, the at least one source pad 110 may be configured to turn power received from the gate pad 120 on and off thousands of times per second. In embodiments including multiple source pads 110, the POL-RDL package 150 may provide a bridging connection between the source pads 110. Unlike the semiconductor assemblies of the present disclosure, at least some known semiconductor devices include connections to external components as well as bridging connections between of source pads on the surface of the semiconductor device or on the surface of the source pads. Such connections limit available active surface area of the semiconductor device and may induce greater bonding stresses. As best shown in FIGS. 1 through 3, the POL-RDL package 150 includes a dielectric layer 160 and an adhesive layer 162 positioned below the dielectric layer 160. The adhesive layer 162 includes dielectric material layer which adheres to the dielectric layer 160 and to the semiconductor device 102. That is, the adhesive layer 162 is positioned between the dielectric layer 160 and the semiconductor device 102. In some embodiments, the dielectric layer 160 includes an adhesive material to adhere directly to the semiconductor device 102 without the use of the adhesive layer 162.

The POL-RDL package 150 is positioned above the semiconductor device 102 and the dielectric layer 160 is adhered to the semiconductor device 102 by the adhesive layer 162. In some embodiments, the dielectric layer 160 is in the form of a lamination or a film, and may be formed of one a plurality of dielectric materials, such as Kapton® polyimide, Ultem® polyetherimide, polytetrafluoroethylene (PTFE), Upilex®, polysulfone materials (e.g., Udel® polysulphone, Radel® polyphenolsulphone), silica ($SiO_2$), hafnium silicate ($HfSiO_4$), zirconium silicate ($ZrSiO_4$) and barium titanate ($BaTiO_3$), or another polymer film, such as a liquid crystal polymer (LCP) or a polyimide material. In one embodiment, the POL-RDL package 150 has a total thickness in the range of 25 microns to 300 microns At least one source pad 170, at least one contact pad 180, and a gate pad 190 are formed on an upper surface 161 of the dielectric layer 160. In this embodiment, the at least one contact pad 180 is electrically coupled to the at least one source pad 170 by a trace connection 172 extending between the at least one contact pad 180 to the at least one source pad 170. The trace connection 172 has a resistance value different from a resistance value of the at least one contact pad 180. In some embodiments, to achieve the different resistivity values, the trace connection 172 is made from a different material than the at least one contact pad 180. Additionally or alternatively, in some embodiments, to achieve the different resistivity values, the trace connection 172 has a width smaller than a width of the at least one contact pad 180. In some embodiments, the at least one contact pad 180 is a Kelvin gate contact.

At least one source via pathway 164 and a gate via pathway 166 extend through the dielectric layer 160 and the adhesive layer 162. As best shown in FIG. 4, the POL-RDL package 150 also includes a metal interconnect structure 167 that extends through the least one source via pathway 164 and the gate via pathway 166. The metal interconnect structure 167 electrically couples the top contact surface 112 of the at least one source pad 110 of the semiconductor device 102 to the at least one source pad 170 of the POL-RDL package 150, and likewise electrically couples the top contact surface 122 of the gate pad 120 of the semiconductor device 102 to the gate pad 190 of the POL-RDL package 150.

In some embodiments, the metal interconnect structure 167 is formed by filling the at least one source via pathway 164 and the gate via pathway 166 with a conductive material (i.e., conductive epoxy, paste, or solder and the like). In some embodiments, the metal interconnect structure 167 is formed during deposition of the at least one source pad 170 and the gate pad 190. By way of example, as the at least one source pad 170 and the gate pad 190 are deposited, the at least one source via pathway 164 and the gate via pathway 166 are also filled. Subsequently the at least one source pad 170 and the gate pad 190 are electroplated to a desired thickness.

Figure 5:
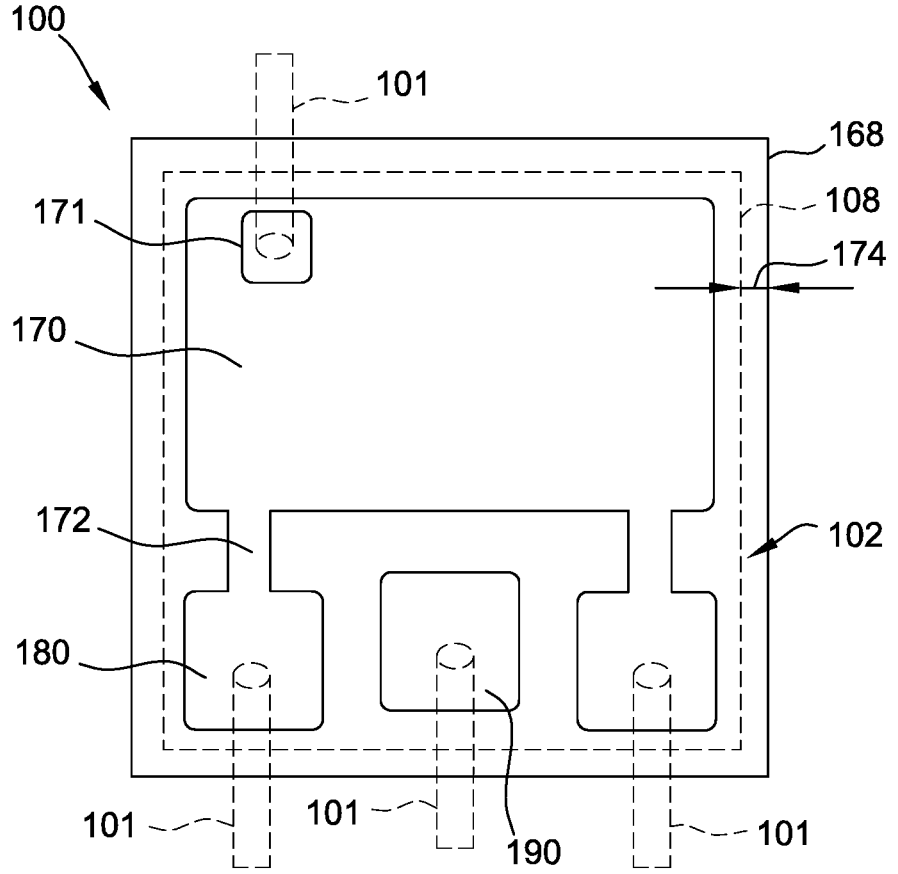
FIG. 5 is atop view of the semiconductor assembly of FIG. 1.

The at least one contact pad 180 is electrically coupled to the at least one source pad 170 such that the gate pad 190 establishes an input-output (I/O) connection with the source pad 170 and/or the at least one contact pad 180. The input-output (I/O) connection enables connection of the semiconductor device 102 to an external circuit, such as a printed circuit board (PCB). In some embodiments, electrical connections include one or more of soldering, sintering, copper bonding, copper clipping and the like. By way of example, as shown in FIG. 5, electrical leads 101 can be attached to the gate pad 190, to the source pad 170, and to the least one contact pad 180. In such a configuration, the least one contact pad 180 is a Kelvin contact. In some embodiments, a solder mask layer is applied over the at least one source pad 170 to provide a protective coating and define interconnect pads 171 for attaching of electrical leads 101 to the at least one source pad 170. In an alternative embodiment, the interconnect pads may have a metal finish to aid solderability, such as Ni, Cu, Ni/Au, Cu/Ni/Au, Cu/Ni/Pd/Au.

To establish a proper connection, the at least one contact pad 180, the source pad 170, and the gate pad 190 must have a sufficient surface area to make the electrical connection. However, the surface area of the at least one contact pad 180, the source pad 170, and the gate pad 190 is ultimately limited by the overall surface area of the dielectric layer 160. By way of example, each of the at least one source pad 170, the at least one contact pad 180, and the gate pad 190 disposed on the dielectric layer 160 are positioned a distance from an outer peripheral edge 168 of the dielectric layer 160. Furthermore, each of the at least one source pad 170, the at least one contact pad 180, and the gate pad 190 disposed on the dielectric layer 160 should be spaced sufficiently far away from one another to isolate the components and prevent electrical leakage.

As best shown in FIGS. 2, 4 and 5, the dielectric layer 160 has a surface area greater than a surface area of the semiconductor device 102 such that the outer peripheral edge 168 of the dielectric layer 160 extends beyond the outer peripheral edge 108 of the semiconductor device 102 to define an overhang region 174. In some embodiments, the adhesive layer 162 extends to the outer peripheral edge 108 of the semiconductor device 102. In some embodiments, the adhesive layer 162 extends to the outer peripheral edge 168 of the dielectric layer 160. In some embodiments, the adhesive layer 162 extends partially to the outer peripheral edge 168 of the dielectric layer 160.

The overhang region 174 allows the at least one contact pad 180, the source pad 170, and the gate pad 190 to have a larger surface area. In particular, in some embodiments, any one of the at least one contact pad 180, the source pad 170, and the gate pad 190 extend to the outer peripheral edge 108 of the semiconductor device 102 as shown in FIG. 4. In some embodiments, the any one of the at least one contact pad 180, the source pad 170, and the gate pad 190 extend into the overhang region 174 and thus, any one of the at least one contact pad 180, the source pad 170, and the gate pad 190 extends beyond the outer peripheral edge 108 of the semiconductor device 102. Similar to the least one contact pad 180, overhang region 174 allows the source pad 170 and the gate pad 190 and the to have a larger surface area.

The POL-RDL package 150 described herein allows for redistribution of the at least one contact pad 180 and the gate pad 120 on the dielectric layer 160, and allows for the at least one contact pad 180 and the gate pad 190 to have a greater surface area to facilitate easier and more robust connections to external circuitry. The POL-RDL package 150 also enables an improved elastic (Young's) modulus of the dielectric layer 160, which reduces bonding stress on the semiconductor device 102. The dielectric layer 160 of the POL-RDL package 150 may be polyimide, which has an elastic modulus of approximately 2.5 GPa, whereas the semiconductor device 102, which may be $SiO_2$, may have an elastic modulus of approximately 70 GPa. The lower elastic modulus is capable of absorbing bonding stress, thereby reducing bonding stress on the semiconductor device 102.

In at least some known semiconductor assemblies, contact pads and gate pads in a POL package may have a surface area of up to 0.6 mm² without the benefit of the overhang region 174. Without the benefit of the additional surface area provided by the overhang region 174, a larger gate pad would necessarily reduce the available area for placement of a source pad and contact pad in the semiconductor device 102, resulting in a lower current rating of the semiconductor device 102.

In contrast, in at least some of the embodiments described herein, the at least one contact pad 180, given the benefit of the overhang region 174, has a surface area in the range of 0.5 mm² to 1.5 mm² while still maintaining the current rating of the semiconductor device 102. In some embodiments, the surface area of the contact pads 180 is greater than 0.6 mm². Thus, the overhang region 174 of the POL-RDL package 150 allows for redistribution of the at least one contact pad 180 and the gate pad 190 while still maintaining the current rating of the semiconductor device 102. Similar to the at least one contact pad 180, the source pad 170 and the gate pad 190 can also have a greater surface area.

The overhang region 174 and greater surface area of the POL-RDL package 150 also facilitate using a wide range of trace connections 172 with varying resistivity values (as shown in FIGS. 8-11). Using different types of trace configurations 172 enables selectively tuning of the resistivity value between the source pad 110 and the at least one contact pad 180. Notably, additional resistance between the at least one source pad 110 and the at least one contact pad 180 reduces crosstalk, thus improving efficiency of the semiconductor device 102. In accordance with the embodiments described herein, the resistance value between the at least one source pad 110 and the at least one contact pad 180 can be selectively adjusted for specific applications without altering the semiconductor device 102 during fabrication and assembly. This allows for simplified fabrication of a base semiconductor device 102 with post-fabrication customization of the trace connections 172 depending on specific customer and application needs.

For example, the resistivity value of the trace connection 172 can be altered by depositing the trace connection 172 with material having different resistivities, by modifying a width of the trace connection 172, and/or by modifying a deposition thickness of the trace connection 172. An exemplary trace connection 172 having a length of 2 mm, a width of 35 mm and a thickness of 10 mm has a resistance of approximately 0.1Ω. In some embodiments, the trace connection 172 has a thickness in the range of 5-25 mm, and a trace width of approximately 25 mm. In some embodiments, the trace connection 172 deposition depth in a range from 50 nm to 50 μm. In some embodiments, the resistivity value of the trace connections 172 is tuned or altered by changing the volume of the trace connection 172, changing the cross-sectional area of the trace connection 172, and/or changing the material of the trace connection 172. In some embodiments, the trace connection 172 is made from a combination of a first material having a first resistivity value and a second material having a second resistivity value, and the second material is laminated or otherwise layered over the first material. The resistivity value of the trace connection 172 may be selectively adjustable within a range of 10 mΩ (micro-ohms) to 100 mΩ. In some embodiments, the trace connection 172 is a resistor. Further, in some embodiments, the trace connection 172 is a surface-mounted resistor.

Figure 6:
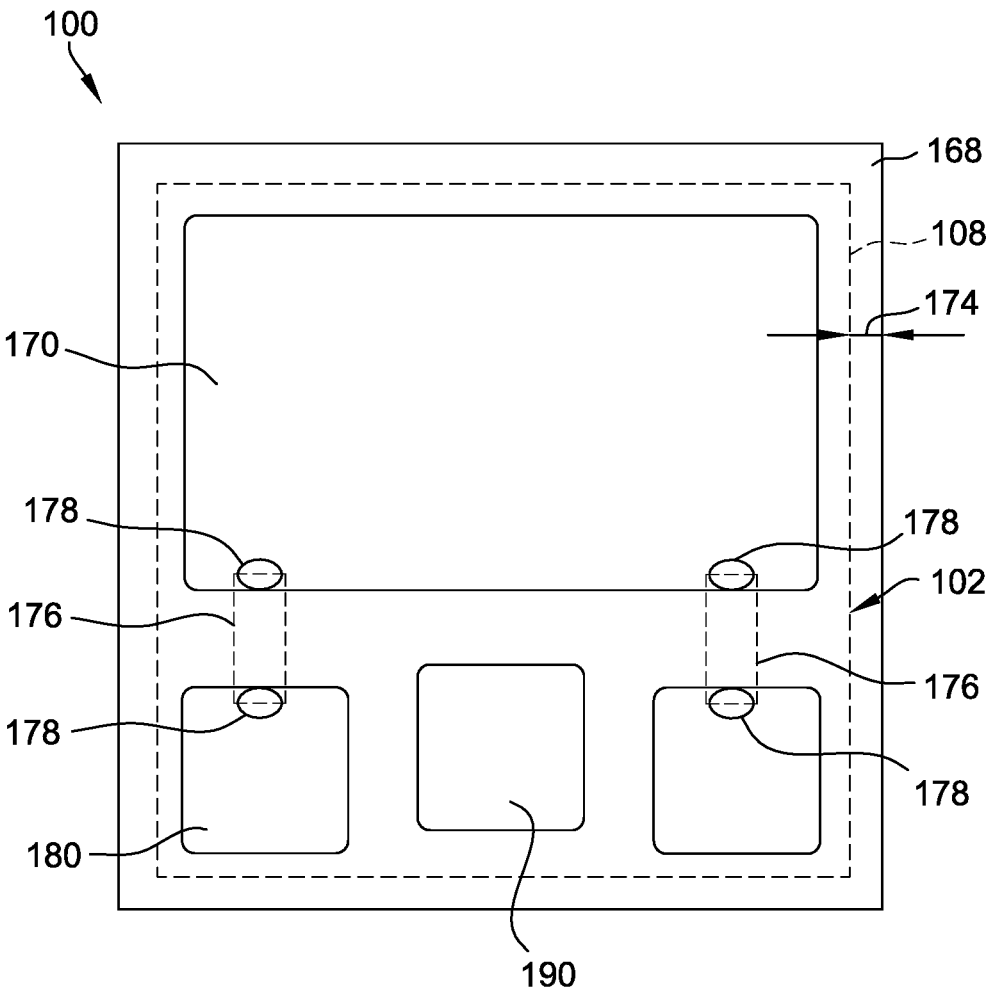
FIG. 6 is a top view of one embodiment of the semiconductor assembly of FIG. 1.

As shown in FIG. 6, in some embodiments, the at least one contact pad 180 and the at least one source pad 170 include attachment pads 178. In such embodiments, the trace connection 172 is implemented as a surface-mounted a resistor 176 coupled between the attachment pads 178. The resistor 176 can be connected to the semiconductor assembly 100 post-fabrication.

FIG. 7 illustrates a method 200 of manufacturing a semiconductor assembly, such as the semiconductor assembly 100 (shown in FIGS. 1-6). The method 200 includes adhering 202 a dielectric layer of a POL-RDL package to an upper surface of a semiconductor device in a panel format, filling 204 at least one source via pathway defined in the dielectric layer with at least one metallization via, and depositing 206 at least one source pad and at least one contact pad onto an upper surface of the dielectric layer. In some embodiments, the method 200 further includes depositing a trace connection having a resistivity value between the at least one source pad and the at least one contact pad. In some embodiments, the method 200 further includes forming solder pads on the at least one source pad and the at least one contact pad of the dielectric layer, and soldering a resistor onto the solder pads.

In some embodiments, the trace connection is formed by sputtering or depositing a resistive material such as Tantalum nitride (TaN) between the at least one source pad and the at least one contact pad In some embodiments, the method 200 further includes forming 208 a copper connection to a top surface of the at least one contact pad to connect the semiconductor assembly to external circuitry In some embodiments, the metallization vias are formed by laser ablation or laser drilling process, plasma etching, photodefinition, and/or mechanical drilling or punching processes. Furthermore, a combination of pre- and post-drilled vias could be employed.

In some embodiments, the metallization layer is formed through a combination of sputtering and electroplating applications, although it is recognized that other electroless methods of metal deposition could also be used. For example, a titanium adhesion layer and a copper seed layer may first be applied via a sputtering process, followed by an electroplating process that increases a thickness of the copper to a desired level. The applied metal material is then subsequently patterned into metal interconnects having a desired shape and that function as vertical feed-throughs formed through the dielectric layer and the adhesive layer.

Figure 8:
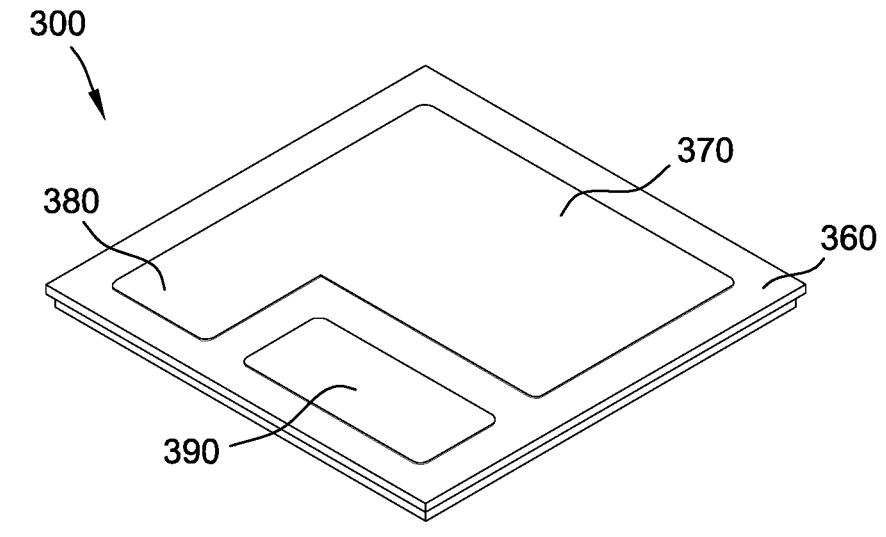
FIG. 8 is perspective view of an alternative embodiment of a semiconductor assembly.
Figure 9:
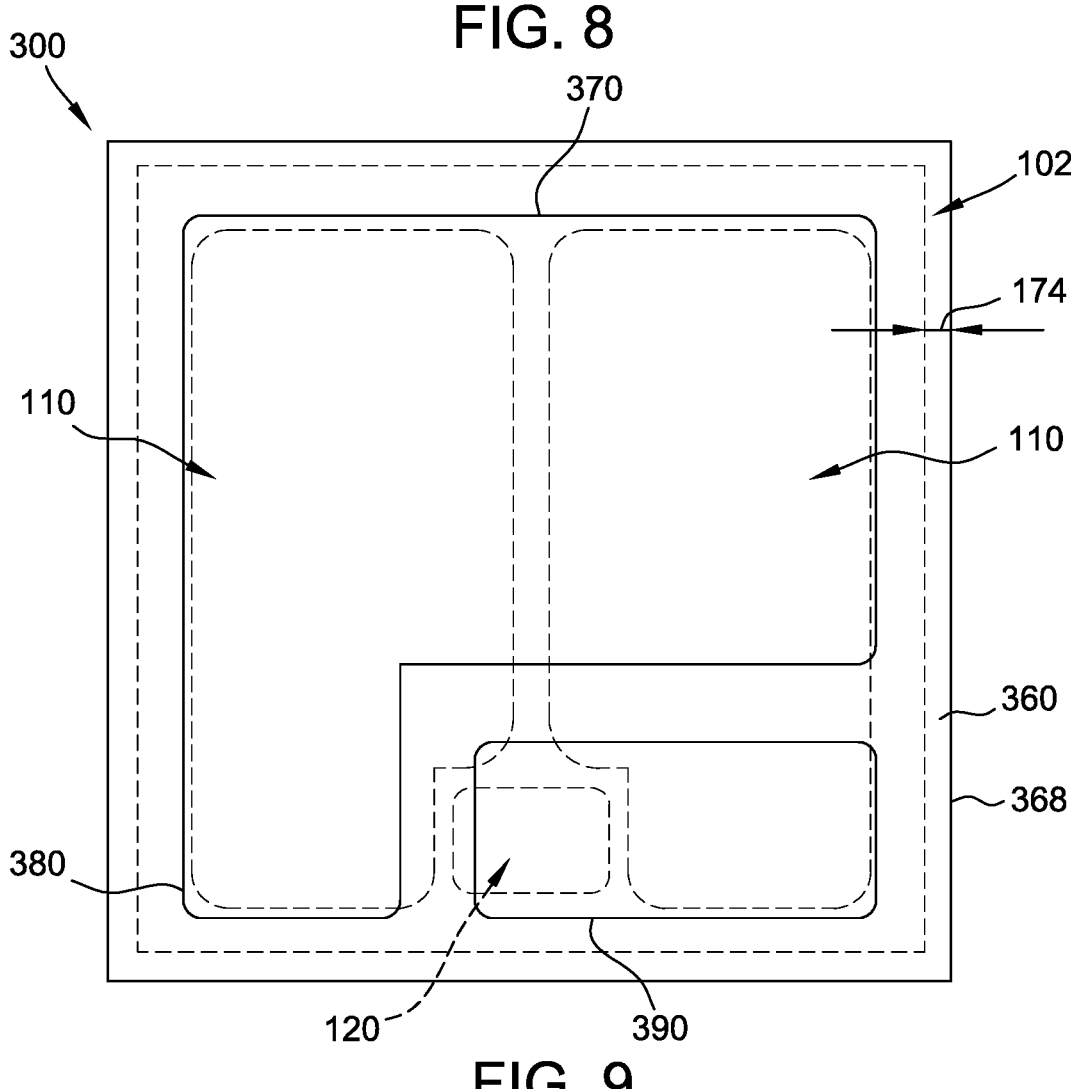
FIG. 9 is a top view of the semiconductor assembly shown in FIG. 8, with the semiconductor device shown in dashed lines.

Referring now to FIGS. 8 and 9, additional alternative embodiments of the configuration of at least one source pad, the gate pad, and the at least one contact pad on the POL-RDL package are illustrated. The semiconductor assembly shown in FIGS. 8 and 9 includes a number of components similar to components shown in semiconductor assembly 100 of FIG. 1.

More specifically, FIG. 8 illustrates a perspective view of one embodiment of a semiconductor assembly 300 including a source pad 370, a contact pad 380 and a gate pad 390 positioned on a dielectric layer 360. FIG. 9 illustrates a top view of the semiconductor assembly 300, with the components of the semiconductor device 102 shown in dashed lines. As shown in FIG. 8, the source pad 370 and contact pad 380 are integral with one another, with no discrete trace connection extending between the source pad 370 and the contact pad 380. The gate pad 390 has a surface area greater than a surface area of the gate pad 190 of FIG. 1. Furthermore, in the illustrated embodiment, there is only one contact pad 380. As shown in FIG. 9, the gate pad 120 of the semiconductor device 102 is vertically aligned with a portion of the gate pad 390 and the source pads 110 of the semiconductor device 102 are vertically aligned with portions of the source pad 370 to facilitate connections between those components. In some embodiments, the source pad 370, a contact pad 380, and a gate pad 390 extend into the overhang region 174.

Figure 10:
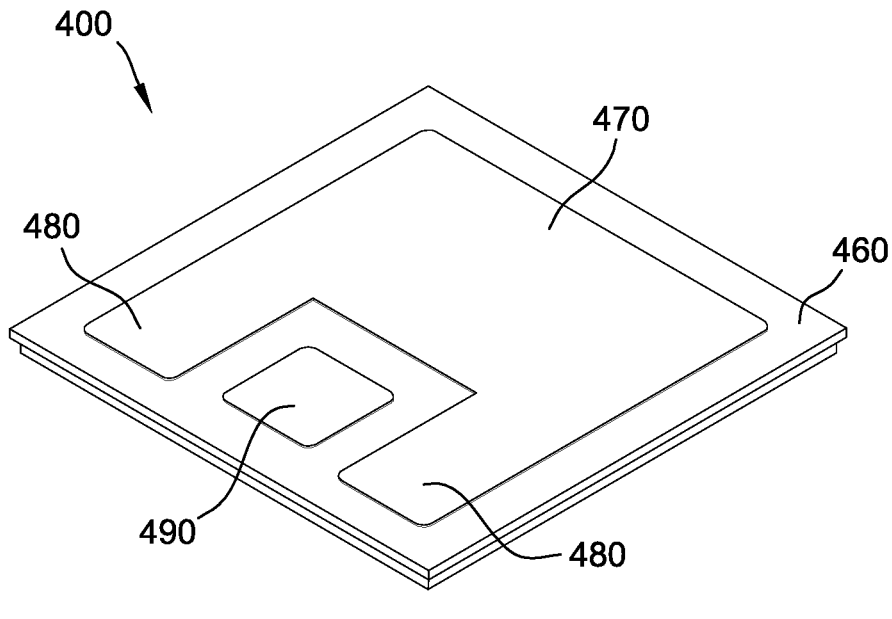
FIGS. 10 and 11 are perspective views of alternative embodiments of a semiconductor assembly.

FIG. 10 shows another embodiment of a semiconductor assembly 400 including a source pad 570, two contact pads 480, and a gate pad 490 positioned on a dielectric layer 460. The source pad 470 and two contact pads 480 are integral, without discrete trace connections extending between the source pad 470 and the two contact pads 480.

Figure 11:
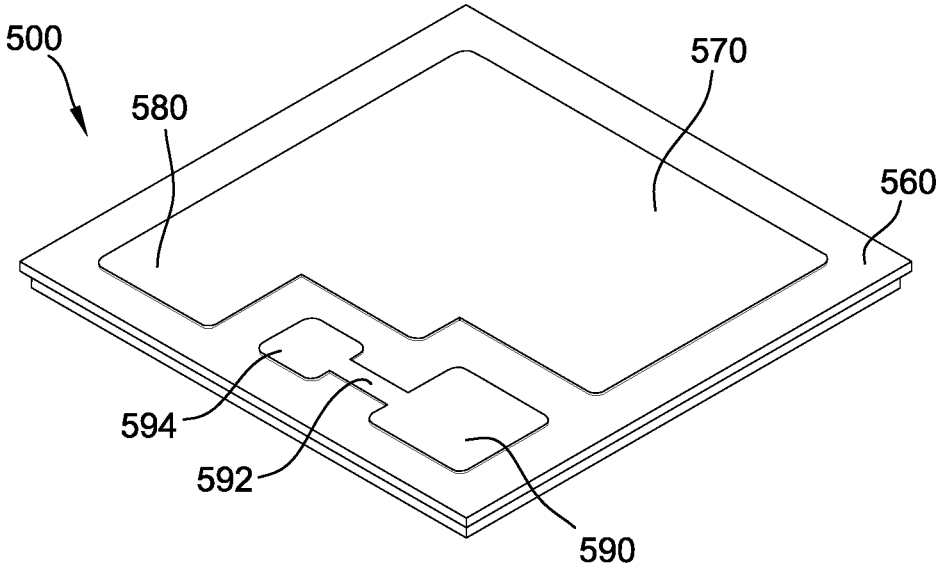

FIG. 11 shows another embodiment of a semiconductor assembly 500 including a source pad 570, a contact pad 580, and a gate pad 590 positioned on a dielectric layer 560. The source pad 570 and contact pad 580 are integral, without a discrete trace connection extending between the source pad 570 and the contact pad 580. In this embodiment, a metallization via connects a gate pad of the semiconductor device to a gate contact 594 on the dielectric layer 560. The gate contact 594 is vertically aligned with the underlying gate pad. Further, a trace connection 592 connects the gate contact 594 to the gate pad 590. In some embodiments, the trace connection 592 has a resistivity value different from a resistivity value of the gate pad 590. In some embodiments, the trace connection 592 is made from a different material from the gate pad 590. In some embodiments, the trace connection 592 has a width smaller than a width of the gate pad 590. Further, in these embodiments, any of the contact pads (380, 480, 580) may have a different surface finish than that of the source pad (370, 470, 570). By way of example, the configurations of the embodiments of FIGS. 8-11 are optimized for GENERAL ELECTRIC® semiconductor devices, however the configurations can be optimized for other semiconductor devices.

The above-described embodiments overcome at least some disadvantages of semiconductor devices. Specifically, the embodiments described herein facilitate redistribution of the contact pads and the gate pad on the dielectric layer, and allow for the contact pads and the gate pad to have a greater surface area for an easier and more robust connections to external circuitry. The POL-RDL package described herein also provides an improved elastic modulus of the dielectric layer, which reduces bonding stress on the semiconductor device. The oversized POL-RDL package also allows for redistribution of the contact pads and the gate pad while still maintaining the current rating of the semiconductor device.

The greater surface area of the POL-RDL package described herein also facilitates using a variety of trace connections with varying resistivity values. The resistivity values of the trace configurations may be selectively adjusted to control the resistivity value between the source pad and the contact pad. Added resistance generally reduces crosstalk, thus improving efficiency of the semiconductor device.

The methods, systems, and compositions disclosed herein are not limited to the specific embodiments described herein, but rather, steps of the methods, elements of the systems, and/or elements of the compositions may be utilized independently and separately from other steps and/or elements described herein.

Although specific features of various embodiments may be shown in some drawings and not in others, this is for convenience only. Moreover, references to "one embodiment" in the above description are not intended to be interpreted as excluding the existence of additional embodiments that also incorporate the recited features. In accordance with the principles of the disclosure, any feature of a drawing may be referenced and/or claimed in combination with any feature of any other drawing.

This written description uses examples, including the best mode, to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor assembly comprising:
   a semiconductor device comprising:
      an upper surface;
      a gate pad disposed on said upper surface; and
      at least one source pad disposed on said upper surface; and
   a power overlay redistribution layer (POL-RDL) package coupled to said semiconductor device and comprising:
      a dielectric layer comprising an upper surface;
      at least one source pad disposed on said upper surface of said dielectric layer and electrically coupled to said at least one source pad of said semiconductor device;
      at least one contact pad disposed on said upper surface of said dielectric layer; and
      at least one trace connection having a resistivity value and electrically coupling said at least one source pad of said POL-RDL package to said at least one contact pad;
      wherein said at least one trace connection is made from a first material having a first resistivity value and said at least one contact pad is made from a second material having a second resistivity value, and wherein said first resistivity value is greater than said second resistivity value.

2. The semiconductor assembly of claim 1 further comprising a gate pad disposed on said upper surface of said dielectric layer and electrically coupled to said gate pad of said semiconductor device.

3. The semiconductor assembly of claim 1, wherein said at least one trace connection has a width less than a width of said at least one contact pad, and wherein the width of said trace connection controls the resistivity value of said trace connection.

4. The semiconductor assembly of claim 1, wherein said second material is layered over said first material.

5. The semiconductor assembly of claim 1 further comprising at least one interconnect pad for attaching of electrical leads to said at least one source pad of the POL-RDL package.

6. The semiconductor assembly of claim 1, wherein said at least one source pad and said at least one contact pad of said POL-RDL package each comprise attachment pads.

7. The semiconductor assembly of claim 1, wherein said POL-RDL package further comprises a gate contact disposed on said dielectric layer; and
   an additional trace connection electrically coupling said gate contact to said gate pad of said semiconductor device.

8. A semiconductor assembly comprising:
   a semiconductor device comprising:
      an upper surface;
      a gate pad disposed on said upper surface; and
      at least one source pad disposed on said upper surface; and a power overlay redistribution layer (POL-RDL) package coupled to said semiconductor device and comprising:
    a dielectric layer comprising an upper surface;
    at least one source pad disposed on said upper surface of said dielectric layer and electrically coupled to said at least one source pad of said semiconductor device;
    at least one contact pad disposed on said upper surface of said dielectric layer; and
    at least one trace connection having a resistivity value and electrically coupling said at least one source pad of said POL-RDL package to said at least one contact pad;
    wherein said at least one source pad and said at least one contact pad of said POL-RDL package each comprise attachment pads;
    wherein said at least one trace connection comprises a resistor mounted to said attachment pads with solder.

9. A semiconductor assembly comprising:
    a semiconductor device comprising:
        an upper surface;
        a gate pad disposed on said upper surface; and
        at least one source pad disposed on said upper surface; and
    a power overlay redistribution layer (POL-RDL) package coupled to said semiconductor device and comprising:
        a dielectric layer comprising an upper surface;
        at least one source pad disposed on said upper surface of said dielectric layer and electrically coupled to said at least one source pad of said semiconductor device;
        at least one contact pad disposed on said upper surface of said dielectric layer; and
        at least one trace connection having a resistivity value and electrically coupling said at least one source pad of said POL-RDL package to said at least one contact pad;
    wherein said semiconductor device comprises a first outer peripheral edge that defines a first surface area, wherein said dielectric layer of said POL-RDL package comprises a second outer peripheral edge that defines a second surface area, wherein the second surface area is greater than the first surface area, and wherein said second outer peripheral edge extends beyond said first outer peripheral edge to define an overhang region.

10. The semiconductor assembly of claim 9, wherein said at least one contact pad extends to said first outer peripheral edge.

11. The semiconductor assembly of claim 9, wherein said at least one contact pad is at least partially disposed in the overhang region.

12. The semiconductor assembly of claim 9, wherein said at least one source pad of said POL-RDL package extends to said first outer peripheral edge.

13. The semiconductor assembly of claim 9, wherein said at least one source pad of said POL-RDL package is at least partially disposed in the overhang region.

14. A method of manufacturing a semiconductor assembly, the method comprising:
    coupling a dielectric layer of a power overlay redistribution layer (POL-RDL) package to an upper surface of a semiconductor device, the semiconductor device including at least one source pad and a gate pad disposed on the upper surface;
    forming at least one source pad of the POL-RDL package on an upper surface of the dielectric layer;

electrically coupling the at least one source pad of the POL-RDL package to the at least one source pad of the semiconductor device;
    forming a gate pad of the POL-RDL package on the upper surface of the dielectric layer;
    electrically coupling the gate pad of the POL-RDL package to the gate pad of the semiconductor device;
    forming at least one contact pad on the upper surface of the dielectric layer; and
    electrically coupling the at least one source pad of the POL-RDL package to the at least one contact pad using at least one trace connection having a resistivity value;
    wherein said at least one trace connection is made from a first material having a first resistivity value and said at least one contact pad is made from a second material having a second resistivity value, and wherein said first resistivity value is greater than said second resistivity value.

15. The method of claim 14, wherein the at least one trace connection has a width less than a width of the at least one contact pad, and wherein the width of the trace connection controls the resistivity value of the trace connection.

16. A method of manufacturing a semiconductor assembly, the method comprising:
    coupling a dielectric layer of a power overlay redistribution layer (POL-RDL) package to an upper surface of a semiconductor device, the semiconductor device including at least one source pad and a gate pad disposed on the upper surface;
    forming at least one source pad of the POL-RDL package on an upper surface of the dielectric layer;
    electrically coupling the at least one source pad of the POL-RDL package to the at least one source pad of the semiconductor device;
    forming a gate pad of the POL-RDL package on the upper surface of the dielectric layer;
    electrically coupling the gate pad of the POL-RDL package to the gate pad of the semiconductor device;
    forming at least one contact pad on the upper surface of the dielectric layer; and
    electrically coupling the at least one source pad of the POL-RDL package to the at least one contact pad using at least one trace connection having a resistivity value;
    wherein the semiconductor device includes a first outer peripheral edge that defines a first surface area, wherein the dielectric layer of the POL-RDL package includes a second outer peripheral edge that defines a second surface area, wherein the second surface area is greater than the first surface area, and wherein the second outer peripheral edge extends beyond the first outer peripheral edge to define an overhang region.

17. A method of manufacturing a semiconductor assembly, the method comprising:
    coupling a dielectric layer of a power overlay redistribution layer (POL-RDL) package to an upper surface of a semiconductor device, the semiconductor device including at least one source pad and a gate pad disposed on the upper surface;
    forming at least one source pad of the POL-RDL package on an upper surface of the dielectric layer;
    electrically coupling the at least one source pad of the POL-RDL package to the at least one source pad of the semiconductor device;
    forming a gate pad of the POL-RDL package on the upper surface of the dielectric layer;
    electrically coupling the gate pad of the POL-RDL package to the gate pad of the semiconductor device;

forming at least one contact pad on the upper surface of the dielectric layer; and electrically coupling the at least one source pad of the POL-RDL package to the at least one contact pad using at least one trace connection having a resistivity value;

further comprising forming attachment pads on the at least one source pad of the POL-RDL package and the at least one contact pad of the dielectric layer.

18. The method of claim 17, wherein electrically coupling the at least one source pad of the POL-RDL package to the at least one contact pad using comprises soldering a resistor onto the attachment pads.

19. The method of claim 18, wherein the resistor has a resistivity value in the range of 10 mΩ to 100 mΩ.

* * * * *